(12) United States Patent
Yang

(10) Patent No.: US 7,221,218 B2
(45) Date of Patent: May 22, 2007

(54) MOSFET AMPLIFIER HAVING FEEDBACK CONTROLLED TRANSCONDUCTANCE

(75) Inventor: Tony Yang, Irvine, CA (US)

(73) Assignee: Wionics Research, Irvine, CA (US)

( * ) Notice: Subject to any disclaimer, the term of this patent is extended or adjusted under 35 U.S.C. 154(b) by 0 days.

(21) Appl. No.: 11/073,019

(22) Filed: Mar. 4, 2005
(Under 37 CFR 1.47)

(65) Prior Publication Data

US 2006/0033562 A1    Feb. 16, 2006

Related U.S. Application Data

(60) Provisional application No. 60/550,527, filed on Mar. 5, 2004.

(51) Int. Cl.
*H03F 1/24* (2006.01)
(52) U.S. Cl. .................. 330/98; 330/107; 330/260; 330/294
(58) Field of Classification Search ............... 330/260, 330/98, 294

See application file for complete search history.

(56) References Cited

U.S. PATENT DOCUMENTS

| 6,064,262 A * | 5/2000 | Wang ............... 330/253 |
| 6,362,687 B2 * | 3/2002 | Cox ............... 330/253 |
| 6,429,684 B1 * | 8/2002 | Houston ............... 326/83 |
| 6,614,301 B2 * | 9/2003 | Casper et al. ............... 330/253 |
| 6,873,209 B2 * | 3/2005 | Takata et al. ............... 330/253 |

OTHER PUBLICATIONS

A 0.9V body effect feedback 2 GHz low noise amplifier, Taris, T.; Begueret, J.B.; Lapuyade, H. and Deval, Y., University of Bordeaux; This paper appears in: European Solid-State Circuits, 2003. ESSCIRC'03. Conference on, Publication Date: Sep. 16-18, 2003, pp. 659-662.

* cited by examiner

*Primary Examiner*—Benny Lee
*Assistant Examiner*—Alan Wong
(74) *Attorney, Agent, or Firm*—Foley & Lardner LLP

(57) ABSTRACT

A signal is applied to the body of a MOSFET to enhance the transconductance of the MOSFET. The signal applied to the body of the MOSFET has essentially the same waveform as an input signal supplied to the gate of the MOSFET, and is shifted by approximately 180 degrees with respect to the input signal. The signal applied to the body of the MOSFET may be provided by a phase-adjusting feedback circuit that generates the signal from a signal representing the output of the MOSFET.

25 Claims, 6 Drawing Sheets

MOSFET AMPLIFIER HAVING FEEDBACK CONTROLLED TRANSCONDUCTANCE

RELATED APPLICATIONS

Priority is claimed from U.S. Provisional Application 60/550,527 filed 5 Mar. 2004, the entirety of which is incorporated herein by reference.

BACKGROUND

1. Field of the Invention

The present invention relates to the field of electronic amplifier circuits.

2. Description of Related Art

The growth of technologies such as wireless communication has led to an increasing need for high performance electronic amplifiers that have high gain and low noise.

FIG. 1 shows a typical example of a low noise RF amplifier known as a cascode amplifier. The cascode amplifier includes a first MOSFET transistor 10 and a second MOSFET transistor 12 that are connected in series between a load impedance Zload driven by a voltage source Vdd and a common potential (referred to herein as ground). The first transistor 10 receives an input signal RFin at its gate along with a DC bias voltage supplied by a bias circuit 14. The input signal RFin is amplified in the first transistor 10 to produced an amplified signal at the drain of the first transistor. The amplified signal is received at the source of the second transistor 12 and is conducted through the second transistor 12 to an output node where an output signal RFout is presented. The second transistor 12 typically does not amplify the signal provided by the first transistor 10, but rather is used to prevent the output node from seeing parasitic capacitances of the first transistor, thus lowering the output impedance of the amplifier circuit and improving its frequency response.

As seen in FIG. 1, the substrates of the MOSFET transistors 10, 12 are coupled to their respective sources. This arrangement is utilized to eliminate the substrate bias effect or "body effect," in which the MOSFET substrate (also referred to herein as the "body") acts as a second gate that influences carrier availability in the MOSFET channel region. The body effect is explained in more detail with reference to FIGS. 2 and 3.

FIG. 2 shows a cross-section of a typical n-type MOSFET comprised of a p-type substrate 20 in which n-type source and drain regions 22, 23 are formed at opposing sides of a channel region 24. For purposes of the present explanation, the channel region 24 is shown as having an n-type inversion layer formed therein. A gate dielectric 26 lies between the channel region 24 and a gate electrode 28. A depletion layer 29 separates the p-type and n-type regions. The thickness of the depletion layer with respect to the other elements is exaggerated for purposes of illustration.

The drain current of the MOSFET is controlled by modulating the availability of majority carriers (in this case, conduction band electrons) in the channel region between the source and drain. Carrier availability is largely controlled through a capacitive effect that is caused by application of a voltage to the gate 28. Consequently, variations in the gate voltage produce corresponding variations in carrier availability that cause the drain current to be modulated in a manner that corresponds to modulation of the gate voltage. However, carrier availability is also affected in a similar manner by any voltage applied to the body of the MOSFET. Thus, the MOSFET is typically modeled in the manner shown in FIG. 3. In this model, the behavior of the MOSFET is approximated by a pair of parallel connected current sources 30, 32 that produce a drain current Id. The first current source 30 represents the effect of the gate voltage Vg on carrier availability, which produces a current having a magnitude approximately equal to the MOSFET transconductance Gm times the gate-source voltage Vgs. The second current source 32 represents the effect of the body voltage Vb on carrier availability, which yields a current having a magnitude approximately equal to the body effect transconductance Gmb times the source-body voltage Vsb. As shown by this model, the application of a reverse bias to the source-body junction (i.e., a voltage that widens the depletion layer 29) has an effect that is equivalent to the generation of a current in the channel region that is opposite in polarity to the current produced in response to the gate voltage, resulting in an over-all reduction in the drain current produced in response to a given gate voltage. Since the MOSFET body is typically held at a fixed voltage, the body effect is generally understood to reduce the transconductance of the MOSFET or to increase the threshold voltage of the MOSFET. In order to avoid this effect, MOSFET circuits such as the cascode circuit of FIG. 1 connect the source directly to the body so that the source-body voltage is zero.

SUMMARY

The transconductance of a MOSFET may be enhanced by applying a signal to the body of the MOSFET. The signal has essentially the same waveform as an input signal supplied to the gate of the MOSFET, and is shifted by approximately 180 degrees with respect to the input signal. In the exemplary embodiments described herein, the signal is a feedback signal that is derived from the output of the MOSFET and that is phase-inverted with respect to the signal applied to the gate of the MOSFET. Application of the phase-inverted signal to the body of the MOSFET controls carrier availability in a manner that enhances the effective MOSFET transconductance.

In accordance with one embodiment, an amplifier circuit comprises a MOSFET that receives a periodic input signal at its gate and amplifies the input signal to produce an output signal. A phase-adjusting feedback circuit receiving a signal corresponding to the output signal and applies a phase-adjusted signal to the body of the MOSFET. The phase-adjusting feedback circuit causing a phase shift of the received signal such that the phase-adjusted signal applied to the body of the MOSFET is shifted by approximately 180 degrees with respect to the periodic input signal of the MOSFET.

In accordance with another embodiment, a cascode amplifier circuit comprises a first MOSFET, a second MOSFET having its source connected to the drain of the first MOSFET, and a feedback circuit coupled between the gate of the second MOSFET and the body of the first MOSFET.

In accordance with another embodiment, a differential cascode amplifier circuit comprises a first MOSFET, a second MOSFET having its source connected to the drain of the first MOSFET, a third MOSFET, and a fourth MOSFET having its source connected to the drain of the third MOSFET. A first feedback circuit is coupled between the gate of the second MOSFET and the body of the first MOSFET, and a second feedback circuit coupled between the gate of the fourth MOSFET and the body of the third MOSFET.

In accordance with another embodiment, a differential cascode amplifier circuit comprises a first MOSFET, a second MOSFET having its source connected to the drain of the first MOSFET, a third MOSFET, and a fourth MOSFET having its source connected to the drain of the third MOSFET. A first feedback circuit is coupled between the gate of the second MOSFET and the body of the third MOSFET, and a second feedback circuit is coupled between the gate of the fourth MOSFET and the body of the first MOSFET.

In accordance with another embodiment, a method of producing an amplified signal comprises providing a first signal as an input signal at the gate of a MOSFET, applying a second signal to the body of the MOSFET, where the second signal has approximately the same waveform as the first signal and is shifted by approximately 180 degrees with respect to the first signal, and providing an output signal at a drain of the MOSFET in response to the first signal and the second signal.

Other features and advantages of the invention will become apparent from the following detailed description, taken in conjunction with the accompanying drawings which illustrate, by way of example, various features of embodiments of the invention.

DESCRIPTION OF THE DRAWINGS

A detailed description of embodiments of the invention will be made with reference to the accompanying drawings, wherein like numerals designate corresponding parts in the several figures.

DETAILED DESCRIPTION

In the following description reference is made to the accompanying drawings in which are shown specific embodiments through which the invention may be practiced. It is to be understood that other embodiments may be implemented and changes may be made without departing from the scope of the claimed invention.

Figure 4:
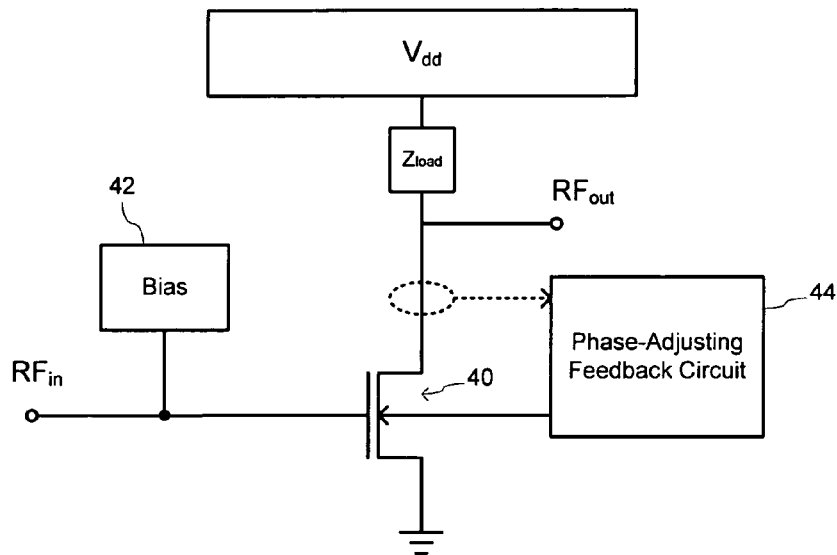
FIG. 4 shows a generalized diagram of a MOSFET amplifier circuit in which feedback is used to enhance transconductance.

FIG. 4 shows a generalized diagram of a MOSFET amplifier circuit in which feedback is used to enhance the effective MOSFET transconductance. The circuit is comprised of an n-type MOSFET 40 arranged as a common source amplifier. The gate of the MOSFET 40 receives an input signal RFin and a bias signal supplied by a bias circuit 42. The drain of the MOSFET receives a bias from a voltage source Vdd through a load impedance Zload. An output signal RFout is produced at the drain. A phase-adjusting feedback circuit 44 receives an input signal that is derived from the drain current of the MOSFET 40 and produces an output signal that is phase-adjusted so as to be shifted by approximately 180 degrees with respect to the MOSFET input signal RFin. The phase-adjusted output signal is applied to the body of the MOSFET. This results in enhancement of the effective transconductance of the MOSFET.

Figure 3:
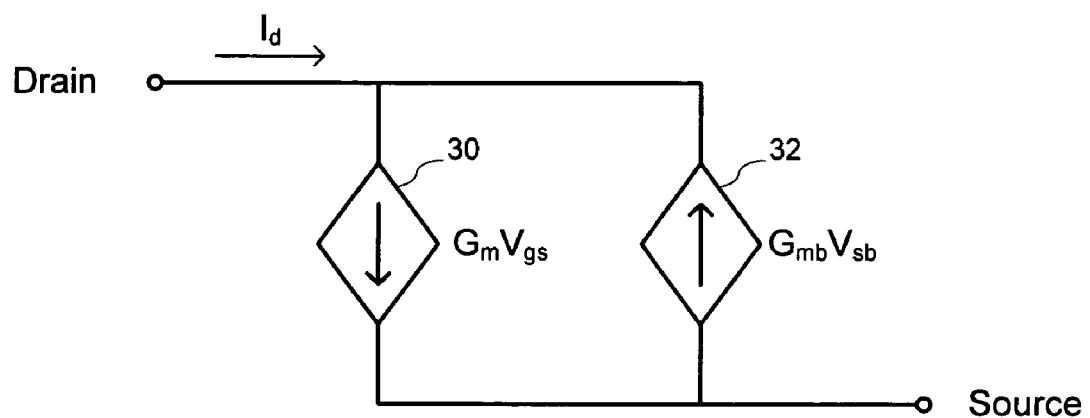
FIG. 3 shows a model of a MOSFET that represents the relationship of the body effect to effective MOSFET transconductance.

The effect of the phase-adjusted feedback signal on transconductance is now explained in more detail. First, as shown in the model of FIG. 3, the MOSFET transconductance corresponding to the gate voltage is represented by Gm, and the body effect transconductance is represented by Gmb. It is inherent that the body effect transconductance Gmb is related to the MOSFET transconductance Gm, and therefore the following relationship is defined:

$$Gmb = \alpha Gm (\alpha \text{ is typically } 0.3) \quad (1)$$

In the model of FIG. 3, the drain current Id of the MOSFET amplifier is represented as:

$$Id = GmVgs - GmbVsb$$

Figure 5:
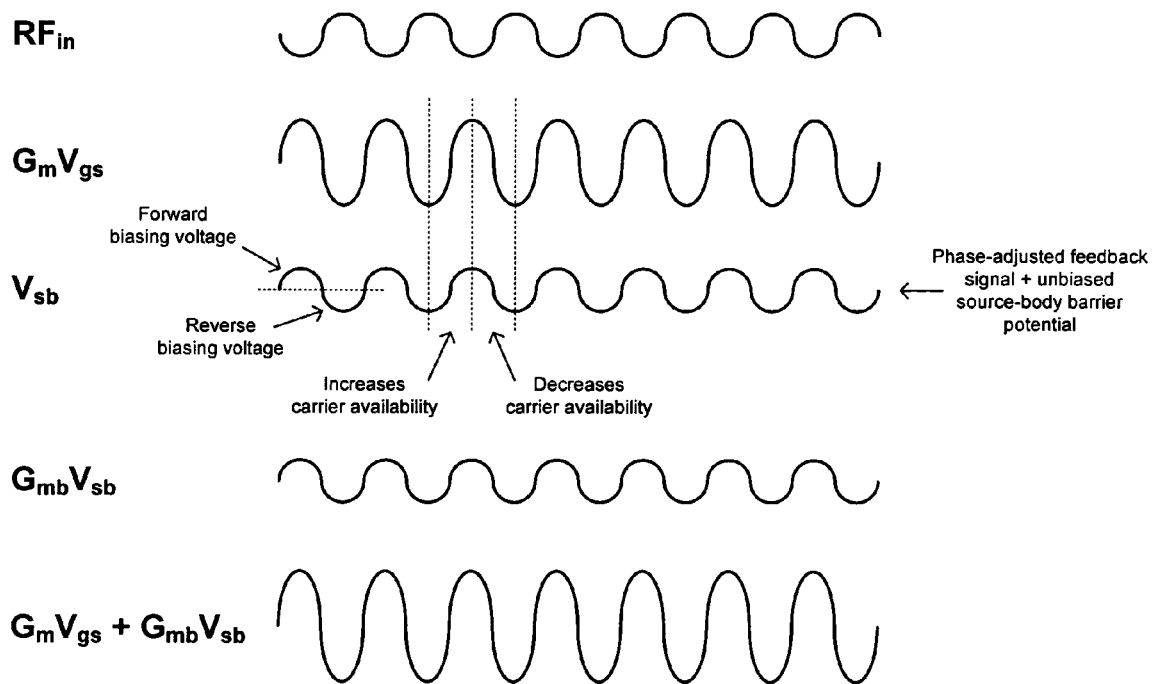
FIG. 5 shows waveforms illustrating an effect that may be achieved by applying a phase-adjusted feedback signal to the MOSFET body.

However, the model of FIG. 3 assumes that Vsb is a static value that ranges from zero to an arbitrary value that applies a reverse bias to the source-body junction and that therefore has the static effect of reducing carrier availability under all conditions. In contrast, in the circuit of FIG. 4, the value Vsb is a dynamic value that alternately provides a reverse bias or a forward bias with respect to the source-body junction in a manner that is synchronized with the input signal RFin. FIG. 5 shows waveforms that illustrate this relationship in more detail. Referring to FIG. 5, a periodic input signal RFin yields an output current component GmVgs. In addition, the application of the phase-adjusted feedback signal to the MOSFET body results in a dynamic source-body voltage Vsb that has an amplitude equal to the sum of the phase adjusted feedback signal and the unbiased source-body barrier potential. Further, the dynamic source-body voltage Vsb is approximately 180 degrees out of phase with respect to the input signal RFin. Consequently, when comparing the dynamic source-body voltage waveform to the waveform of the main drain current component GmVgs, it is seen that the value of Vsb has the effect of increasing carrier availability as a function of the input signal during the period in which the main drain current component GmVgs increases from its minimum value to its maximum value, and has the effect of decreasing carrier availability as a function of the input signal during the period when the main drain current component GmVgs decreases from its maximum value to its minimum value. As a result, application of the phase-adjusted feedback signal to the MOSFET body amplifies the increase of carrier availability during the transition of the drain current from minimum to maximum, and amplifies the decrease of carrier availability during the transition of the drain current from maximum to minimum. This effectively enhances the over-all transconductance of the MOSFET. Thus, in contrast to the model of FIG. 3, the body effect in the MOSFET of FIG. 4 has a constructive rather than a destructive effect on drain current. Accordingly, the drain current Id of the MOSFET amplifier of FIG. 4 may be represented as:

$$Id = GmVgs + GmbVbs \quad (2)$$

Standard relationships may now be utilized to characterize the operation of the MOSFET in the circuit of FIG. 4.

The source voltage of the MOSFET is related to the gate voltage of the MOSFET such that:

$$Vs = \chi Vg, \text{ where } 0 < \chi < 1 \text{ (typically 0.4)}$$

Consequently, the gate voltage may be expressed as a function of the gate to source voltage:

$$Vgs = Vg - Vs = Vg - \chi Vg = (1-\chi)Vg,$$

or, $$Vg = 1/(1-\chi)Vgs \qquad (3)$$

Further, because the phase-adjusted feedback signal applied to the body is derived from the input signal applied to the gate, the body voltage and the gate voltage of the MOSFET are related such that:

$$Vb = \beta Vg$$

where $\beta$ is a feedback factor provided by the phase-adjusting feedback circuit. Consequently, the source-body voltage may be expressed as a function of the gate voltage:

$$Vbs = Vb - Vs = \beta Vg - \chi Vg$$

or, $$Vbs = (\beta - \chi)Vg \qquad (4)$$

Substituting equation (3) into equation (4), the relationship between Vbs and Vgs may be expressed as:

$$Vbs = [(\beta - \chi)/(1-\chi)]Vgs \qquad (5)$$

When the expressions for Gmb and Vbs in equations (1) and (5) are substituted into equation (2), an expression for the drain current Id as a function of the gate-source voltage Vgs is obtained:

$$\begin{aligned} Id &= GmVgs + GmbVbs \qquad (6)\\ &= GmVgs + (\alpha Gm)[(\beta - \chi)/(1-\chi)]Vgs \\ &= \{1 + \alpha\,[(\beta - \chi)/(1-\chi)]\}GmVgs \end{aligned}$$

Equation (6) shows that the drain current Id produced by the circuit of FIG. 4 is greater than the drain current that would be produced if the body was simply connected directly to the source. In other words, the phase-adjusted feedback signal applied to the MOSFET body in the circuit of FIG. 4 enhances the effective transconductance of the MOSFET. The amount of transconductance enhancement may be varied by varying the feedback factor $\beta$ of the phase-adjusting feedback circuit. The feedback factor may be set to any value so long as the peak of the forward-biasing phase of the phase-adjusted feedback signal does not exceed the unbiased source-body barrier potential.

While the principal of transconductance enhancement explained above has been illustrated using a feedback signal as illustrated in FIG. 4, it will be appreciated that this effect may be achieved by applying any signal to the MOSFET body that has approximately the same waveform as the input signal and that is shifted by approximately 180 degrees with respect to the input signal. For example, such a signal may be derived directly from the input signal provided to the MOSFET gate. Alternatively, such a signal may be applied to the MOSFET body by an oscillator circuit that is synchronized to the input signal.

Figure 6:
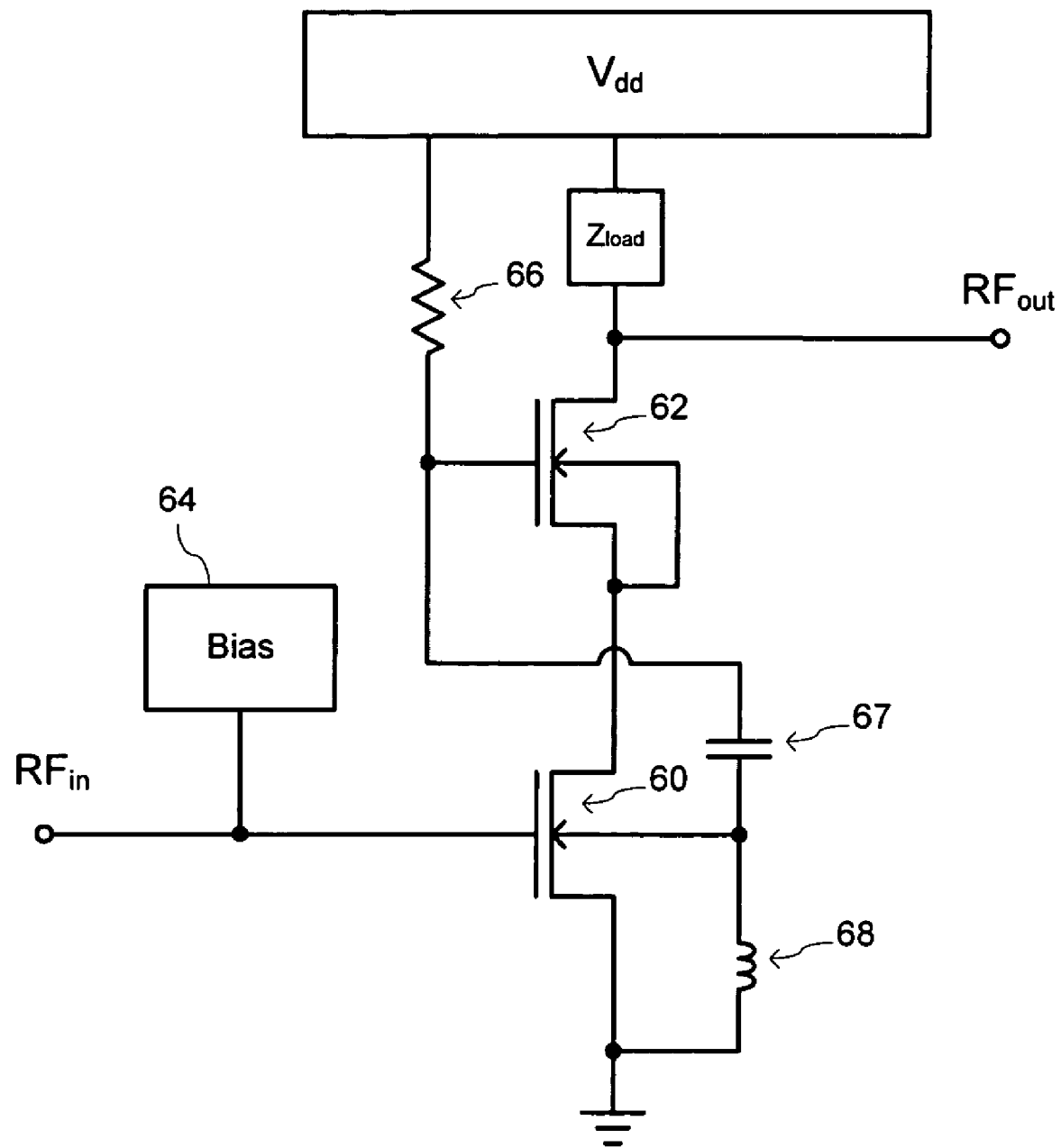
FIG. 6 shows a schematic diagram of a MOSFET amplifier circuit having enhanced transconductance according to a first embodiment of the present invention.

Specific embodiments of the feedback circuit of FIG. 4 are now discussed. FIG. 6 shows an embodiment of the circuit of FIG. 4 in a cascode amplifier circuit. As shown in FIG. 6, the cascode amplifier includes a first n-type MOSFET transistor 60 and a second n-type MOSFET transistor 62 that are connected in series between a voltage source Vdd and ground. The first transistor 60 receives an input signal RFin at its gate along with a DC bias voltage supplied by a bias circuit 64. The input signal RFin is amplified in the first transistor 60 to produced an amplified signal at the drain of the first transistor. The amplified signal is received at the source of the second transistor 62 and is conducted through the second transistor 62 to an output node where an output signal RFout is presented.

Figure 1:
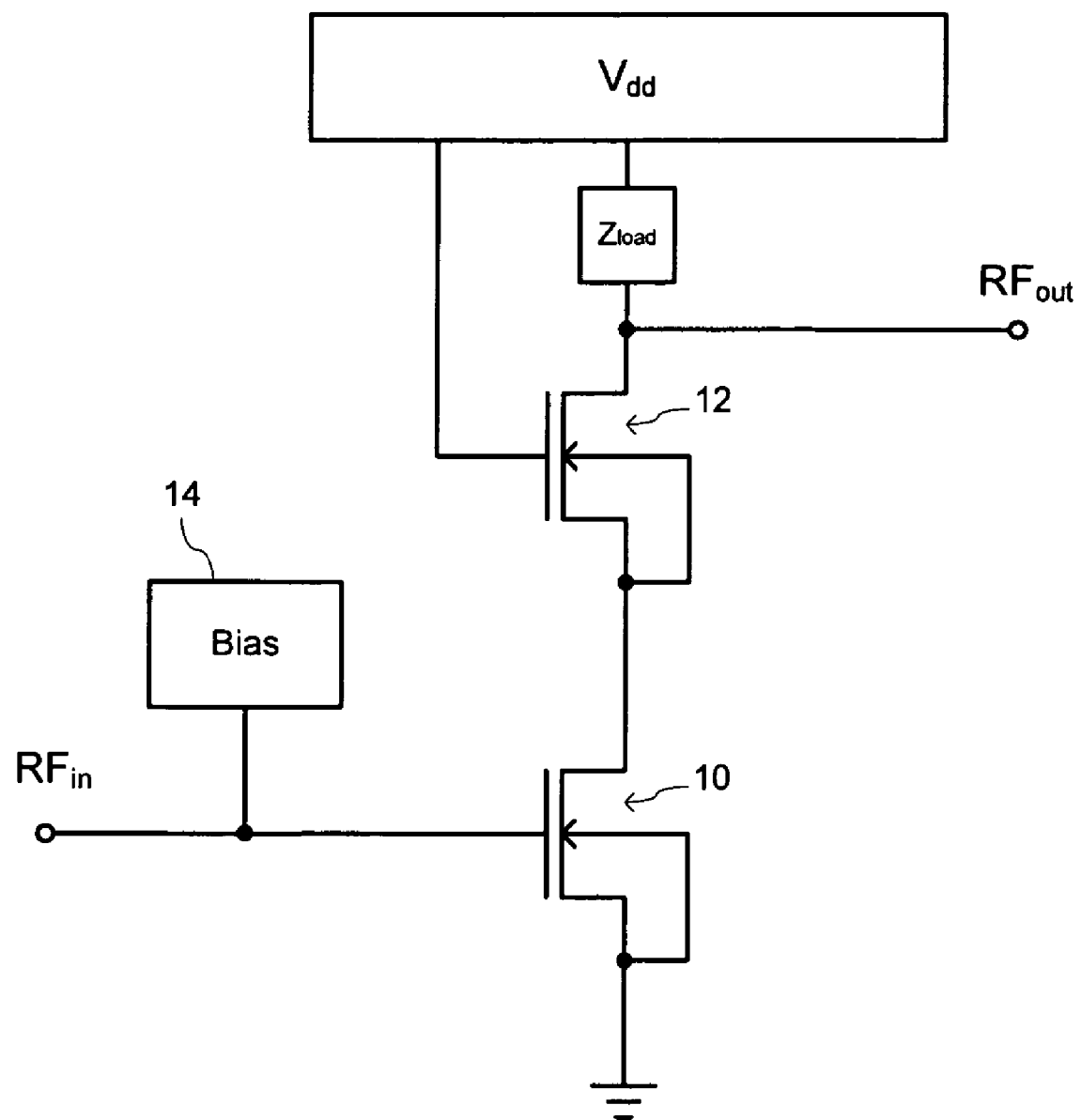
FIG. 1 shows a schematic diagram of a prior art cascode amplifier circuit.
Figure 2:
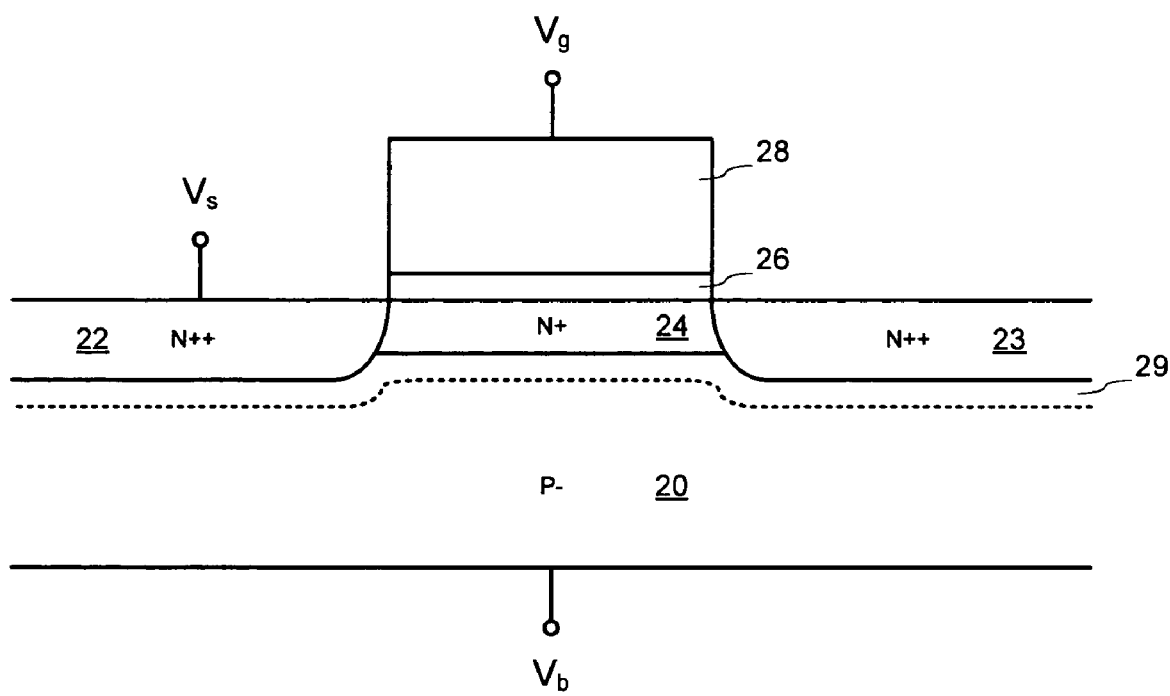
FIG. 2 shows a cross-section of a typical n-type MOSFET.

Unlike the conventional cascode circuit of FIG. 1, the circuit of FIG. 6 includes a phase-adjusting feedback circuit that applies a phase-adjusted feedback signal to the body of the amplifying first transistor 60. In the implementation shown in FIG. 6, the feedback circuit obtains a feedback signal from the gate of the second transistor 62, which is modulated by the signal passing between the source and drain of the second transistor. The feedback circuit is comprised of a resistor 66, capacitor 67 and inductor 68 coupled between Vdd and ground, with the gate of the second transistor 62 coupled to a node between the resistor 66 and the capacitor 67, and the body of the first transistor coupled to a node between the capacitor 67 and the inductor 68. The inductor 68 may be implemented as a down bond inductance that is effected by connecting the substrate to an available pin on the casing of the circuit package. The values of the resistor 66, capacitor 67 and inductor 68 are chosen such that the signal present at the node between the capacitor 67 and the inductor 68 is phase shifted by approximately 180 degrees with respect to the input signal RFin supplied to the first transistor 60. The implementation of FIG. 6 is desirable because the signal obtained from the gate of the second transistor 62 has a relatively small amplitude that is easily attenuated to provide a feedback factor $\beta$ that is within the acceptable range for application to the body of the first MOSFET 60. It should be appreciated however that in alternative embodiments the feedback signal may be derived in other manners, such as from the signal Rfout at the output node of the second transistor 62, and that the components and values of the feedback network will be chosen accordingly.

Figure 7:
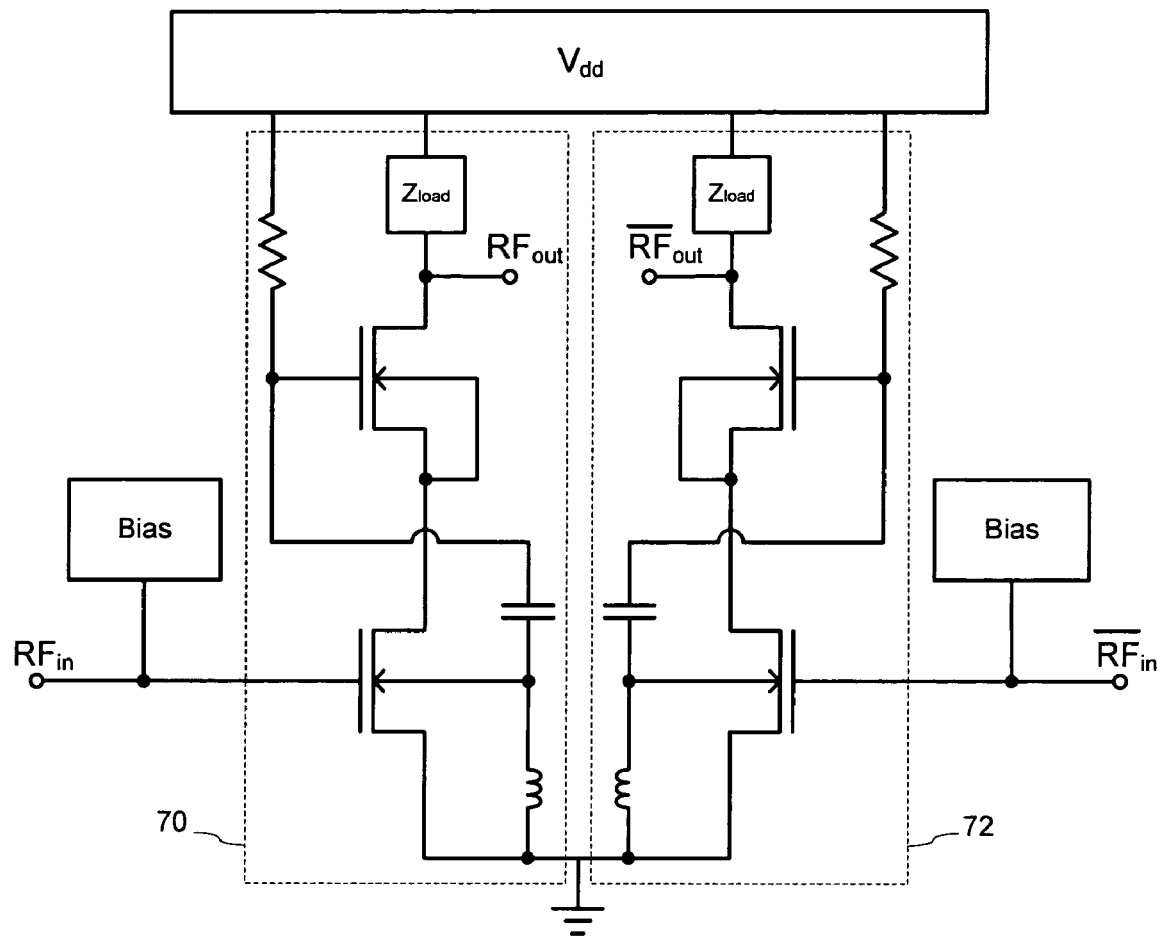
FIG. 7 shows a schematic diagram of a MOSFET amplifier circuit having enhanced transconductance according to a second embodiment of the invention having a differential topology.

A second embodiment of an amplifying circuit in accordance with the invention is illustrated in FIG. 7. This circuit implements a pair of cascode circuits of the type shown in FIG. 6 in a differential topology, such that each of the complementary input signals is amplified by a respective cascode amplifier 70, 72 that includes a feedback network for applying a respective phase-adjusted feedback signal to the body of the amplifying transistor.

Figure 8:
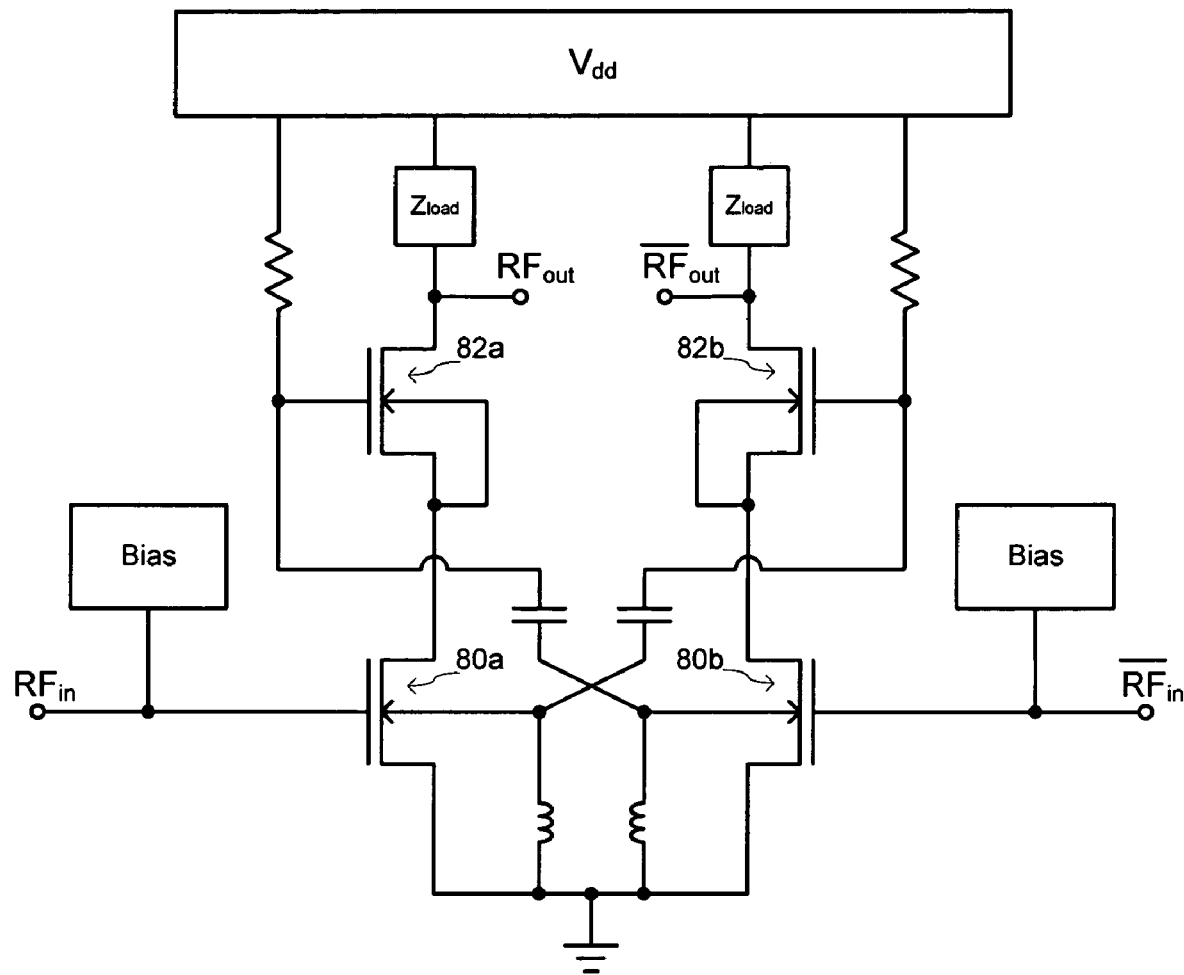
FIG. 8 shows a schematic diagram of a MOSFET amplifier circuit having enhanced transconductance according to a third embodiment of the invention having a differential topology.

A third embodiment of an amplifying circuit in accordance with the invention is illustrated in FIG. 8. This circuit is similar to the circuit of FIG. 7 in that it implements a pair of cascode circuits of the type shown in FIG. 6 in a differential topology, such that each of the complementary input signals is amplified by a respective cascode amplifier. However this circuit differs from the circuit of FIG. 7 in that the feedback signals applied to the bodies of the respective amplifying MOSFETs 80a, 80b of the cascode amplifiers are derived from the gate signals of the respective second MOSFETs 82a, 82b of the opposite cascode amplifier. In particular, the signal applied to the body of the amplifying MOSFET 80a is derived from the gate signal of the second MOSFET 82b of the other cascode amplifier, and the signal applied to the body of the amplifying MOSFET 82a is derived from the gate signal of the second MOSFET 80b of the other cascode amplifier. This implementation may be desirable in some instances because the input and output signals of the respective cascode amplifiers are phase shifted with respect to one another by approximately 180 degrees, and so a signal derived from one amplifier may require significantly less phase adjustment before being applied to the MOSFET body of the other amplifier, allowing the sizes and values of the feedback circuit components to be reduced.

While the embodiments described herein involve n-type cascode amplifiers, the methods for transconductance enhancement described herein may be applied to any MOSFET amplifying circuit. Embodiments of the present invention are well-suited for low-noise amplifiers used for amplifying signals in the GHz range, including wireless technologies such as wireless LAN transceivers, cellular telephony devices, and other wireless or handheld devices.

The circuits, devices, features and processes described herein are not exclusive of other circuits, devices, features and processes, and variations and additions may be implemented in accordance with the particular objectives to be achieved. For example, circuits as described herein may be integrated with other circuits not described herein to provide further combinations of features, to operate concurrently within the same devices, or to serve other purposes. Circuits as described may also be operable in states not illustrated herein while also being operable at different times in the illustrated states. Thus, while the embodiments illustrated in the figures and described above may be presently preferred for various reasons as described herein, it should be understood that these embodiments are offered by way of example only. The invention is not limited to a particular embodiment, but extends to various modifications, combinations, and permutations that fall within the scope of the claims and their equivalents.

What is claimed is:

1. An amplifier circuit comprising:
   a first MOSFET receiving a periodic input signal at its gate and amplifying the input signal to produce an output signal;
   a second MOSFET having its source coupled to the drain of the first MOSFET; and
   a phase-adjusting feedback circuit receiving a signal from a gate of the second MOSFET and applying a phase-adjusted signal to the body of the first MOSFET, the phase-adjusting feedback circuit causing a phase shift of the received signal such that the phase-adjusted signal applied to the body of the first MOSFET is shifted by approximately 180 degrees with respect to the periodic input signal of the first MOSFET.

2. The amplifier circuit claimed in claim 1, wherein the phase adjusting feedback circuit comprises:
   an inductance coupled between the body of the first MOSFET and ground; and
   a capacitance coupled between the body of the first MOSFET and the gate of the second MOSFET.

3. The amplifier circuit claimed in claim 1, wherein the phase-adjusting feedback circuit conducts a signal from the gate of the second MOSFET to the body of the first MOSFET.

4. A cascode amplifier circuit comprising:
   a first MOSFET;
   a second MOSFET having its source connected to the drain of the first MOSFET; and
   a feedback circuit coupled between the gate of the second MOSFET and the body of the first MOSFET to conduct a signal from the gate of the second MOSFET to the body of the first MOSFET.

5. The cascode amplifier circuit claimed in claim 4, wherein the feedback circuit produces a phase shift in an input signal received from the gate of the second MOSFET such that an output signal supplied to the body of the first MOSFET is shifted by approximately 180 degrees with respect to an input signal received at the gate of the first MOSFET.

6. The cascode amplifier circuit claimed in claim 4, wherein the feedback circuit comprises a capacitance coupled between the gate of the second MOSFET and the body of the first MOSFET, and an inductance coupled between the body of the first MOSFET and a ground potential.

7. The cascode amplifier circuit claimed in claim 6, further comprising:
   a voltage source supplying a voltage to the drain of the second MOSFET; and
   a resistor coupled between the gate of the second MOSFET and the voltage source.

8. A differential cascode amplifier circuit comprising:
   a first MOSFET;
   a second MOSFET having its source connected to the drain of the first MOSFET;
   a third MOSFET;
   a fourth MOSFET having its source connected to the drain of the third MOSFET;
   a first feedback circuit coupled between the gate of the second MOSFET and the body of the first MOSFET; and
   a second feedback circuit coupled between the gate of the fourth MOSFET and the body of the third MOSFET.

9. The differential cascode amplifier circuit claimed in claim 8, wherein the first feedback circuit produces a phase shift in an input signal received from the gate of the second MOSFET such that an output signal supplied to the body of the first MOSFET is shifted by approximately 180 degrees with respect to an input signal received at the gate of the first MOSFET, and
   wherein the second feedback circuit produces a phase shift in an input signal received from the gate of the fourth MOSFET such that an output signal supplied to the body of the third MOSFET is shifted by approximately 180 degrees with respect to an input signal received at the gate of the third MOSFET.

10. The differential cascode amplifier circuit claimed in claim 8, wherein the first feedback circuit comprises a capacitance coupled between the gate of the second MOSFET and the body of the first MOSFET, and an inductance coupled between the body of the first MOSFET and a ground potential, and
    wherein the second feedback circuit comprises a capacitance coupled between the gate of the fourth MOSFET and the body of the third MOSFET, and an inductance coupled between the body of the third MOSFET and a ground potential.

11. The differential cascode amplifier circuit claimed in claim 10, further comprising:
    a voltage source supplying a voltage to the drains of the second and fourth MOSFETs;
    a first resistor coupled between the gate of the second MOSFET and the voltage source; and
    a second resistor coupled between the gate of the fourth MOSFET and the voltage source.

12. A differential cascode amplifier circuit comprising:
a first MOSFET;
a second MOSFET having its source connected to the drain of the first MOSFET;
a third MOSFET;
a fourth MOSFET having its source connected to the drain of the third MOSFET;
a first feedback circuit coupled between the gate of the second MOSFET and the body of the third MOSFET; and
a second feedback circuit coupled between the gate of the fourth MOSFET and the body of the first MOSFET.

13. The differential cascode amplifier circuit claimed in claim 12, wherein the first feedback circuit produces a phase shift in an input signal received from the gate of the second MOSFET such that an output signal supplied to the body of the third MOSFET is shifted by approximately 180 degrees with respect to an input signal received at the gate of the third MOSFET, and
wherein the second feedback circuit produces a phase shift in an input signal received from the gate of the fourth MOSFET such that an output signal supplied to the body of the first MOSFET is shifted by approximately 180 degrees with respect to an input signal received at the gate of the first MOSFET.

14. The differential cascode amplifier circuit claimed in claim 12, wherein the first feedback circuit comprises a capacitance coupled between the gate of the second MOSFET and the body of the third MOSFET, and an inductance coupled between the body of the third MOSFET and a ground potential, and
wherein the second feedback circuit comprises a capacitance coupled between the gate of the fourth MOSFET and the body of the first MOSFET, and an inductance coupled between the body of the first MOSFET and a ground potential.

15. The differential cascode amplifier circuit claimed in claim 14, further comprising:
a voltage source supplying a voltage to the drains of the second and fourth MOSFETs;
a first resistor coupled between the gate of the second MOSFET and the voltage source; and
a second resistor coupled between the gate of the fourth MOSFET and the voltage source.

16. A method of producing an amplified signal comprising:
providing a first signal as an input signal at the gate of a MOSFET;
applying a second signal to the body of the MOSFET, the second signal having approximately the same waveform as the first signal and being shifted by approximately 180 degrees with respect to the first signal; and
providing an output signal at a drain of the MOSFET in response to the first signal and the second signal,
wherein a peak voltage amplitude of the second signal does not exceed an unbiased source-body barrier potential of the MOSFET.

17. The method circuit claimed in claim 16, wherein the second signal is generated by a feedback circuit that receives as input an output signal of the MOSFET.

18. The method circuit claimed in claim 16, wherein the second signal is generated by a feedback circuit that receives as input an output signal of a second MOSFET coupled in a cascode fashion to the MOSFET.

19. The method circuit claimed in claim 16, wherein the second signal is generated by a feedback circuit that receives as input a gate signal of a second MOSFET coupled in a cascode fashion to the MOSFET.

20. The method circuit claimed in claim 16, wherein the second signal is generated by an oscillator circuit synchronized with the first signal.

21. An amplifier circuit comprising:
a MOSFET receiving a periodic input signal at its gate and amplifying the input signal to produce an output signal; and
a phase-adjusting feedback circuit receiving a signal corresponding to the output signal and applying a phase-adjusted signal to the body of the MOSFET, the phase-adjusting feedback circuit causing a phase shift of the received signal such that the phase-adjusted signal applied to the body of the MOSFET is shifted by approximately 180 degrees with respect to the periodic input signal of the MOSFET,
wherein the phase adjusting feedback circuit comprises:
an inductance coupled between the body of the MOSFET and ground; and
a capacitance coupled between the body of the MOSFET and a node providing the signal corresponding to the output signal.

22. The amplifier circuit claimed in claim 21, wherein the amplifier further comprises a second MOSFET having its source coupled to the drain of the MOSFET that receives the periodic input signal at its gate, and
wherein the capacitance is coupled to the gate of the second MOSFET.

23. A cascode amplifier circuit comprising:
a first MOSFET;
a second MOSFET having its source connected to the drain of the first MOSFET; and
a feedback circuit coupled between the gate of the second MOSFET and the body of the first MOSFET,
wherein the feedback circuit comprises a capacitance coupled between the gate of the second MOSFET and the body of the first MOSFET, and an inductance coupled between the body of the first MOSFET and a ground potential.

24. The cascode amplifier circuit claimed in claim 23, wherein the feedback circuit produces a phase shift in an input signal received from the gate of the second MOSFET such that an output signal supplied to the body of the first MOSFET is shifted by approximately 180 degrees with respect to an input signal received at the gate of the first MOSFET.

25. The cascode amplifier circuit claimed in claim 24, further comprising:
a voltage source supplying a voltage to the drain of the second MOSFET; and
a resistor coupled between the gate of the second MOSFET and the voltage source.

* * * * *